United States Patent
Padovani

(10) Patent No.: US 11,477,061 B2
(45) Date of Patent: Oct. 18, 2022

(54) WIRELESS DIGITAL COMMUNICATION METHOD AND SYSTEM FOR THE COMMUNICATION BETWEEN TWO ELECTRONIC DEVICES OF AN INDUSTRIAL APPARATUS

(71) Applicant: Marposs Societa' Per Azioni, Bentivoglio (IT)

(72) Inventor: Roberto Padovani, Minerbio (IT)

(73) Assignee: Marposs Societa' Per Azioni, Bentivoglio (IT)

( * ) Notice: Subject to any disclaimer, the term of this patent is extended or adjusted under 35 U.S.C. 154(b) by 13 days.

(21) Appl. No.: 17/260,879

(22) PCT Filed: Jul. 26, 2019

(86) PCT No.: PCT/EP2019/070280
§ 371 (c)(1),
(2) Date: Jan. 15, 2021

(87) PCT Pub. No.: WO2020/025507
PCT Pub. Date: Feb. 6, 2020

(65) Prior Publication Data
US 2021/0273833 A1   Sep. 2, 2021

(30) Foreign Application Priority Data

Jul. 31, 2018 (IT) .................. 102018000007652
Jul. 31, 2018 (IT) .................. 102018000007657

(51) Int. Cl.
*G01S 11/08* (2006.01)
*H04L 27/04* (2006.01)
(Continued)

(52) U.S. Cl.
CPC .............. *H04L 27/04* (2013.01); *G01S 11/08* (2013.01); *H04B 17/27* (2015.01); *H04W 76/10* (2018.02); *H04W 4/80* (2018.02)

(58) Field of Classification Search
CPC ... G01S 3/02; G01S 5/02; G01S 11/08; G01S 13/00; G01S 13/74; H04B 1/04;
(Continued)

(56) References Cited

U.S. PATENT DOCUMENTS 5,640,160 A    6/1997  Miwa
6,295,019 B1 *  9/2001  Richards ................. G01S 13/76
                                                                 342/194
(Continued)

*Primary Examiner* — Shawkat M Ali
(74) *Attorney, Agent, or Firm* — Blank Rome LLP

(57) ABSTRACT

Wireless digital communication method for the communication between two electronic devices (3, 16) of an industrial apparatus (1), including—encoding each bit of information by a respective sequence of a certain number (N) of pulses (25) that alternate with a corresponding number (N−1) of silence intervals (26), each pulse having a pulse duration (TI) shorter than or equal to ns and said silence intervals having respective silence durations (TSj) longer than or equal to 30 ns—transmitting, by a first electronic device, a radio signal (RS) comprising a plurality of radio pulses corresponding to the sequence of pulses without modulating any radio carrier, and—receiving and decoding, by the other electronic device, said radio signal to obtain said bit of information. The method may include additional steps for exchanging information between the electronic devices according to which one of the electronic devices, while in a stand-by state, transmits a request message, waits for a reply message from the other electronic device (if and when some conditions are complied with) and, upon receiving the reply message, switches to an operating state in which the two electronic devices are communicatively coupled to each other.

22 Claims, 2 Drawing Sheets

(51) Int. Cl.
*H04B 17/27* (2015.01)
*H04W 76/10* (2018.01)
*H04W 4/80* (2018.01)

(58) Field of Classification Search
CPC . H04B 1/10; H04B 1/69; H04B 1/707; H04B 7/26; H04B 14/02; H04B 17/27; H04L 7/033; H04L 9/06; H04L 25/00; H04L 25/49; H04L 27/04; H04W 4/00; H04W 2/80; H04W 12/10; H04W 52/00; H04W 74/08; H04W 76/10
USPC ......... 342/29, 118, 125, 195, 387, 458, 465; 375/130, 219, 295, 316; 455/296, 307, 455/456.3
See application file for complete search history.

(56) References Cited

U.S. PATENT DOCUMENTS

| | | |
|---|---|---|
| 2002/0110190 A1 | 8/2002 | Walker |
| 2002/0190881 A1* | 12/2002 | Low ................... H04B 1/71637 341/133 |
| 2012/0014412 A1 | 1/2012 | Nakagawa et al. |
| 2014/0248909 A1 | 9/2014 | Kuntagod et al. |
| 2017/0171889 A1* | 6/2017 | Biswas ............. H04W 52/0229 |
| 2018/0006801 A1* | 1/2018 | Hung ...................... H03L 7/085 |
| 2019/0036568 A1* | 1/2019 | Kovacic ............... H04B 5/0031 |

* cited by examiner

WIRELESS DIGITAL COMMUNICATION METHOD AND SYSTEM FOR THE COMMUNICATION BETWEEN TWO ELECTRONIC DEVICES OF AN INDUSTRIAL APPARATUS

TECHNICAL FIELD

The present invention relates to a wireless digital communication method for the communication between two electronic devices of an industrial apparatus and a corresponding wireless digital communication system.

In particular, the present invention finds an advantageous, but not exclusive application in the communication between at least a movable probe and at least one base station fixed to the frame of a machine tool, to which the description that follows will make reference refers purely by way of example.

BACKGROUND ART

Wireless communication systems used in the field of industrial equipment and apparatuses are known, for example for the wireless communication between a probe, for example a probe including a feeler device, and a base station fixed to the frame of a machine tool. Such wireless communication systems transmit information from an electronic device to another by using a carrier signal, for example an optical carrier in the infrared band or a radio carrier, having a characteristic that is properly modulated by a modulating signal that contains such information. The characteristic of the carrier that is modulated is, for example, the amplitude, the phase or the frequency.

Whatever the characteristic of the carrier that is modulated and whatever the information content of the modulating signal, during the transmission of the information content the carrier signal is continuously transmitted, i.e. the wireless communication based on a modulated carrier produces a continuous emission of electromagnetic field.

The disadvantages in the field of industrial applications are:
- a considerable power consumption, which is particularly undesired in a movable probe that is power supplied by a battery,
- the interference between more wireless communication systems coexisting in a same working area, and
- the existence of the phenomenon called multi-path fading, which produces areas of strong destructive interference that are substantially impossible to identify in an actual, industrial working environment where there are many metal objects, the presence of which is not known a priori, and many people that move.

Moreover, any probe of an industrial apparatus must typically be communicatively coupled to a base station so that they can recognize each other during their communications and the base station of a certain machine tool is prevented from taking into account the transmissions of a probe operating in connection with another machine tool. In the known systems employing a wireless communication protocol, the mutual recognition or authentication between a probe and a base station requires the intervention of an operator or an external system to launch a recognition procedure or authentication.

DESCRIPTION OF THE INVENTION

Object of the present invention is to provide a wireless communication method and a relevant system between two electronic devices of an industrial apparatus which are free of the above described disadvantages and at the same time are cheap to implement and easy to produce.

In accordance with the present invention, there are provided a wireless digital communication method for the communication between two electronic devices of an industrial apparatus, a wireless digital communication system for the communication between two electronic devices of an industrial apparatus and an industrial apparatus as defined in the attached claims.

BRIEF DESCRIPTION OF THE DRAWINGS

A non-limiting embodiment of the present invention will be described by way of example with reference to the accompanying drawings, in which.

BEST MODES FOR CARRYING OUT THE INVENTION

Figure 1:
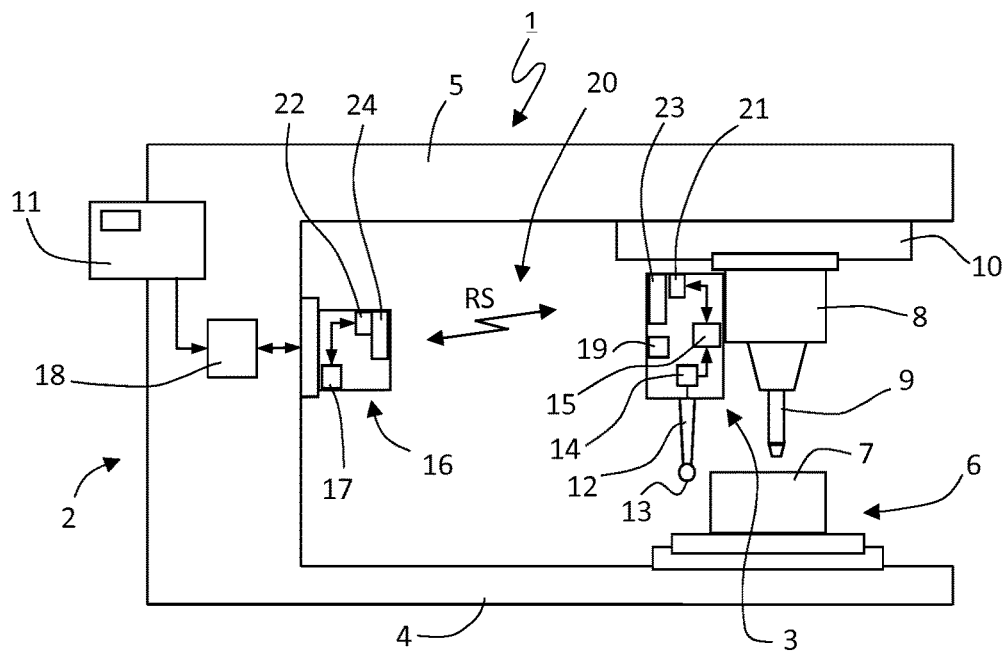
FIG. 1 schematically shows an industrial apparatus comprising two electronic devices communicating with each other by means of a wireless communication method according to the present invention.

In FIG. 1, the number 1 indicates as a whole an industrial apparatus comprising a machine tool 2 and a probe 3 of the "touch trigger" type.

The machine tool 2 comprises a base 4, a frame 5 rigidly coupled to the base 4, a working area 6 in which a workpiece 7 is arranged, and a movable operative head 8 comprising, for example, a spindle carrying a tool 9 adapted to machine the workpiece 7. The operative head 8 is mounted on the frame 5 in such a manner as to be able to slide along guides 10 fixed to the frame 5 so as to be able to move in the working area 6. The machine tool 2 further comprises a numerical control unit indicated by the number 11.

The probe 3 is connectable to the operative head 8, more specifically it can be fixed to the body of the operative head 8 to carry out checks on the workpiece 7, and in particular for checking the position and the dimensions of the workpiece 7 before, during and after its machining, and to provide corresponding readings. Typically, the probe 3 and the operative head 8 are alternatively coupled to the tool 9, even though, for the sake of simplicity of illustration, FIG. 1 shows both the probe 3 and the tool 9 simultaneously fixed to the operative head 8.

In particular, the probe 3 comprises a movable arm 12, which is provided, at one end, with a feeler 13, a detecting device 14 including for example a microswitch, adapted to generate an electric signal as soon as the feeler 13 touches the piece 7, and a control unit 15, for example a microcontroller, coupled to the detecting device 14 to receive from the latter the electric signal generated by the touch. It should be noted that the movable arm 12, the feeler 13 and the detecting device 14 form a touch trigger probe.

The machine tool 2 comprises a base station 16, which can be connected to the frame 5, as schematically shown in the figure, and comprises a control unit 17, for example a microcontroller, connected to the numerical control unit 11 by means of a communication interface 18.

The probe 3 further comprises an accelerometer 19 for detecting accelerations along at least one predetermined direction.

The industrial apparatus 1 comprises a wireless digital communication system, generally indicated at 20, for the communication between the two electronic devices constituted by the probe 3 and the base station 16. One and the other of the two electronic devices can be identified as the first electronic device and the second electronic device. The communication system 20 implements the method or wireless digital communication protocol of the present invention.

The communication system 20 comprises, for each one of the two electronic devices 3 and 16 respective encoding and decoding devices 21 and 22 for encoding the bits of information and thus obtain signals to be transmitted and for decoding the received signals and so determining the bits of information.

Figure 2:
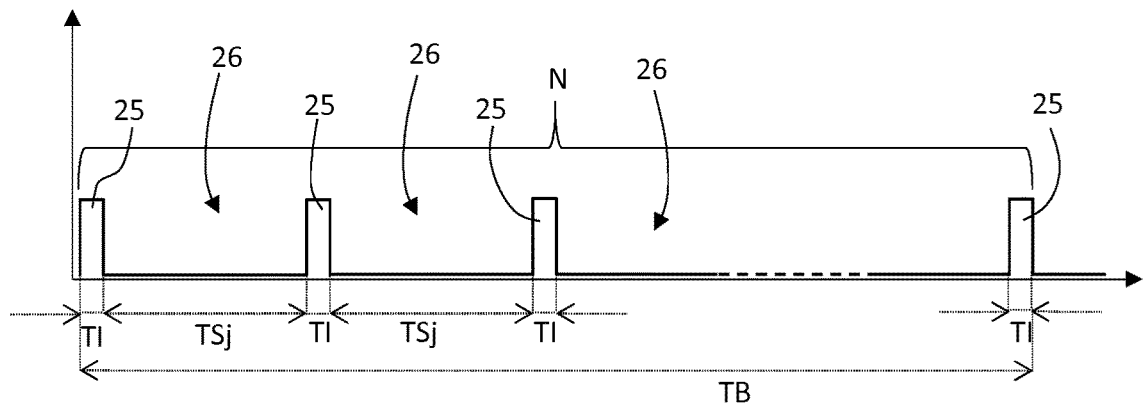
FIG. 2 is a time chart illustrating part of a wireless communication method according to the present invention.

The two electronic devices 3 and 16 also include respective radio transceivers 23 and 24 connected to the relative encoding and decoding devices 21 and 22. FIG. 2 refers to a transmission of a digital signal from the probe 3 to the base station 16 or vice versa. Each encoding and decoding device 21, 22 is configured to encode at least one bit of information of the digital signal, preferably each bit of information, with a respective sequence of a certain number N of pulses 25 which are alternated to a corresponding number (N–1) of silence intervals 26. In other words, two adjacent pulses 25 are spaced apart by a silence interval 26. The sequence of N pulses 25 has a total duration equal to a bit time, indicated with TB. Each pulse 25 is defined by a time function which is substantially energy-limited and has a pulse duration TI shorter than or equal to 10 ns, preferably the same duration TI for each pulse 25. The silence intervals 26 have respective silence durations TSj, each of which is longer than or equal to 30 ns.

FIG. 2 schematically illustrates each pulse 25 as having a rectangular waveform, which however is not an essential feature of the invention.

The transceiver 23 (or 24) of the electronic device 3 (or 16) that transmits is configured to transmit a radio signal, indicated with RS in FIG. 1, comprising a plurality of radio pulses corresponding to the sequence of pulses 25, without modulating any radio carrier. In other words, each pulse of the radio signal RS is substantially an energy-limited pulse and has substantially the same pulse duration TI and the pulses of the radio signal RS are spaced substantially with the silence durations TSj. The transceiver 24 (or 23) of the electronic device 16 (or 3) which receives is configured to receive the radio signal RS and feed it to the respective encoding and decoding device 22 (or 21) which is configured to decode such radio signal RS to obtain each bit of information.

The communication system 20 is advantageously used in the industrial apparatus 1 for transmitting in digital form the readings provided by the probe 3 to the base station 16. The control unit 17 of the base station 16 is configured to collect the readings received via the communication system 20. In particular, the control unit 15 of the probe 3 is configured to convert the electrical signal supplied by the detecting device 14 into a digital signal, that is a bit or typically a sequence of more bits, that is encoded by the encoding and decoding device 21 in the manner described above with reference to FIG. 2 and is transmitted via radio (radio signal RS) by the respective transceiver 23. In the base station 16, the transceiver 24 receives the radio signal RS, and the respective encoding and decoding device 22 decodes the radio signal RS to obtain a digital signal which is collected by the control unit 17.

The communication system 20 is also used for transmissions in the opposite direction, i.e. to transmit in digital form commands and programming controls from the base station 16 to the probe 3.

Figure 3:
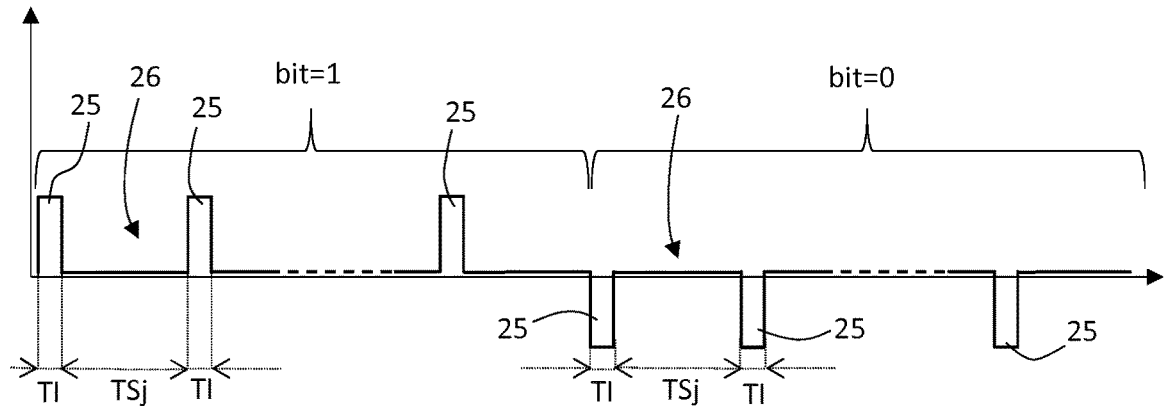
FIGS. 3 to 6 are time diagrams illustrating different embodiments of an encoding step of a wireless communication method according to the present invention.

With particular reference to FIG. 3, each encoding and decoding device 21, 22 is configured to modulate the polarities of the pulses 25 of each sequence of N pulses on the basis of the value of the corresponding bit of information. In the example of FIG. 3, if the bit of information has high logical value (bit=1 in FIG. 3), then the pulses 25 all have positive value, otherwise if the bit of information has a low logic value (bit=0 in FIG. 3), then the pulses 25 all have negative value, i.e. opposite polarity, as commonly intended in phase modulation, for example BPSK modulation. The silence durations TSj are the same as each other.

Figure 4:
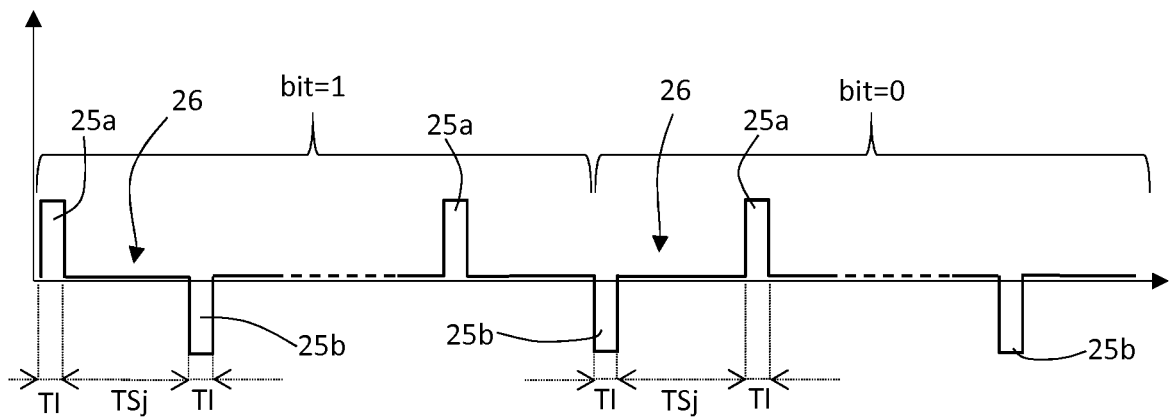

According to a further embodiment of the present invention illustrated in FIG. 4, which is a variant of that of FIG. 3, if the bit of information has high logical value, then the sequence of pulses 25 is characterized by an alternation of positive 25a and negative 25b pulses, otherwise if the bit of information has a low logic value, then the sequence of pulses 25 features a different alternation of pulses. Such a different alternation may consist of pulses having polarity that is opposite or, preferably, orthogonal to the one that characterizes the bit of information having a high logic level, in order to make readily distinguishable the high logic value and the low logic value of the bits of information during the decoding performed by the encoding and decoding device 21, 22. Sequences of pulses orthogonal to each other means sequences of pulses having low mutual cross-correlation.

Figure 5:
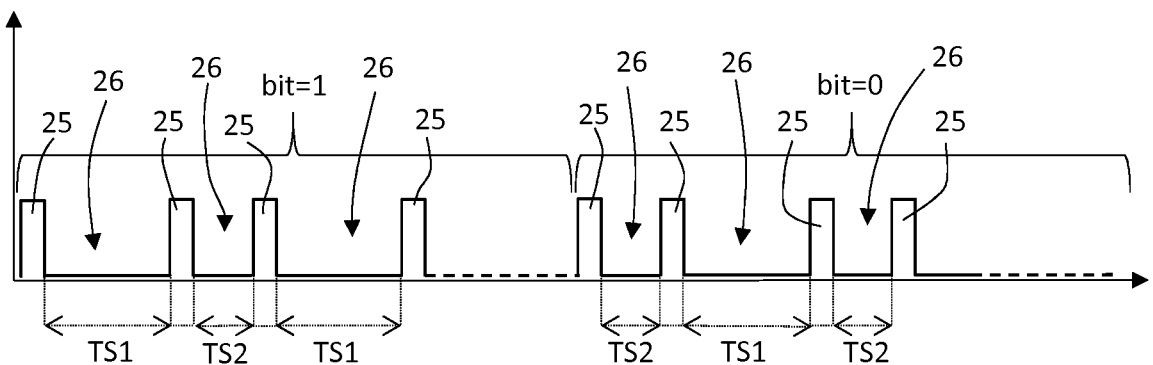

According to a further embodiment of the present invention illustrated in FIG. 5, each encoding and decoding device 21, 22 is configured to modulate the silence durations TSj in each sequence of N pulses 25 as a function of the value of the corresponding bit of information (Pulse Position Modulation), and in particular according to two distinct sequences of duration in order to make readily distinguishable the high logic value and the low logic value of the bits of information.

In the example illustrated in FIG. 5, if the bit of information has high logical value, then the silence durations TSj are modulated in accordance with a first alternation of two values TS1 and TS2 starting from a first value TS1 that is, for example, greater than the second value TS2. Otherwise if the bit of information has low logic value, then the silence durations TSj are modulated in accordance with a second alternation of the same two values TS1 and TS2 starting from the second value TS2. In other words, the two distinct sequences of durations according to which the silence durations TSj are modulated may be defined as binary sequences.

According to further embodiments of the present invention, which are variations of the embodiment of FIG. 5 and are not illustrated in the drawings, the two distinct sequences of durations according to which the silence durations TSj are modulated are ternary sequences (that is they include three different values of the silence durations TSj that alternate to one another), or are sequences of an order greater than three.

Figure 6:
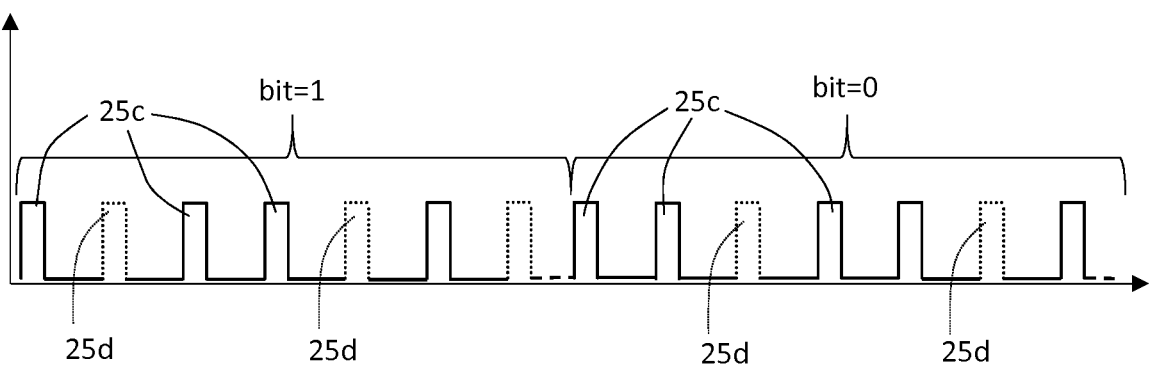

According to a further embodiment of the present invention illustrated in FIG. 6, each encoding and decoding device 21, 22 is configured to modulate the amplitude of the pulses 25 of each sequence of N pulses as a function of the value of the corresponding bit of information in accordance with a On-Off Keying (OOK) modulation, and in particular in accordance with two different pulse sequences which differ from each other for a different number of pulses that are suppressed, i.e. that are not transmitted. The silence durations TSj are the same as each other.

In the example of FIG. 6, the pulses that are present are indicated with 25c and those that are suppressed are illustrated with a dashed line and indicated with 25d.

In further embodiments of the present invention, that are not shown in the drawings, at least some of the above-described modulation techniques of the pulses 25 (amplitude or polarity/phase modulation) and of the silence durations TSj are combined with each other to define mixed modulations that are able to increase the robustness of the communication. For example, each encoding and decoding device 21, 22 is configured to modulate the polarities of the pulses 25 and simultaneously the silence durations TSj according to two distinct sequences of durations.

By way of example, if information is transmitted at a rate of 1 Mbps, with a number N=32 of pulses for each bit of information and pulse duration TI=2 ns, over a period of 1 μs, that is over the period of time that is needed to transmit one bit of information, an electromagnetic field is emitted only for a period of 64 ns, that is only for the 6.4% of the time. This allows to guarantee a considerable energy efficiency. It can be observed that in this example the silence durations TSj are equal to about 30.2 ns.

Since the velocity of propagation of the electromagnetic waves is slightly less than the speed of light in vacuum, that is $3'10^8$ m/s, the signal RS runs across a distance of 1 m in about 3.3 ns and across a distance of 10 m in about 33 ns. This means that if the pulse duration TI is shorter than 3.3 ns and the silence interval is longer than 33 ns, in an area of an annulus comprised between an inner circumference having radius of 1 m and an outer circumference having radius of 10 m pulses 25 do not overlap, thanks also to the rapid attenuation of the pulses 25 after a few reflections on the surfaces of any obstacles present between the probe 3 and the base station 16. In fact, the extremely reduced pulse duration TI causes the spectral content of the signal RS to be shifted to very high frequencies which are strongly attenuated as the propagation distance increases.

An extremely reduced pulse duration TI and silence durations TSj much longer than the pulse duration TI (for example ten times the duration pulse duration TI) and the absence of a modulated carrier, allow to greatly reduce the multi-path fading phenomenon. In fact, the continuous emission of a radio carrier creates a distribution of the electromagnetic field at a distance from the transmitter that, as compared with the propagation times of the electromagnetic waves, is substantially stationary and has an infinite number of repetitions in the space of areas of constructive and destructive interference that are substantially impossible to identify in an actual, industrial working environment where there are many metal objects and people that move. If one of the two electronic devices 3 and 16 is arranged in a region of destructive interference, there would be a worsening of the quality of the communication, which could even cause a communication loss. The signal RS characterized by radio pulses of very short duration reduces the multi-path fading because it does not produce said stationary distribution of electromagnetic field or even eliminates the multi-path fading in an area of finite dimensions determined by suitably choosing the proportion between the pulse duration TI and the silence durations TSj, as in the example mentioned above.

Advantageously, each transceiver 23 and 24 comprises a respective receiver (not shown) configured as a so called rake receiver for receiving at least part of the reflected signals deriving from signal RS in order to collect the energy from all the not-directed paths of the signal and therefore render more robust the communication, that is to obtain a higher ratio between signal and noise in reception. The task of the rake receiver is facilitated in the hypothesis that the reflected pulses of the signal RS are sufficiently separated in time from each other and from the direct pulse.

Another advantage of the wireless digital communication method and of the corresponding communication system 20 of the present invention is the possibility to allow several communication systems to coexist that is to say to simultaneously operate—in the same area. Such coexistence is made possible thanks to the possibility to choose encoding schemes of the bits of information, as far as the number of pulses N and the silence durations TSj are concerned, that are different from each other. In particular, each encoding scheme must show a high self-correlation, that is a high correlation with respect to a time shifted replica of a signal coded with the same scheme, and a low cross-correlation, that is a low correlation with respect to a time shifted replica of a signal coded with different encoding schemes.

According to a further aspect of the invention the control units 15 and 17 are configured to implement a method of exchanging information between the probe 3 and the base station 16 based on the wireless digital communication protocol described above.

Before being fixed to the operative head 8, the probe 3 is typically housed in a magazine and is in a stand-by state to reduce to a minimum the consumption of electric energy. When the probe 3 is the stand-by state, its control unit 15 periodically generates an event as a result of which the probe 3 transmits a request message intended to be addressed to the base station 16. The request message is transmitted according to the previously described wireless digital communication protocol, that is to say: the request message comprises a plurality of bits each of which is encoded with a sequence of a number N of pulses 25 to which the sequence of radio pulses of the radio signal RS corresponds.

The request message also comprises a timestamp which indicates the instant of transmission of the first pulse of the sequence of pulses 25 of the first bit of information of the request message. The instant of transmission is determined on the basis of an internal clock of the control unit 15 and on the basis of internal delays of the coder and decoder 21.

The base station 16 receives the request message and decodes it to extract the timestamp including the information about the instant of transmission. The control unit 17 of the base station 16, in cooperation with the respective transceiver 24, detects the instant of reception of the first pulse of the received request message.

At this point the control unit 17 calculates the time of flight of the request message, that is the propagation time of the radio signal RS that has brought the request message by the probe 3 to the base station 16 on the basis of the instant of transmission and the instant of reception, and estimate the distance between the probe 3 and the base station 16 as a function of the time of flight. If the estimated distance complies with a predetermined condition, for example if such estimated distance is less than a predetermined distance indicating the extension of the working area 6, then the base station 16 transmits a reply message.

The probe 3, when receiving the reply message, switches to an operating state in which the two electronic devices 3, 16 are communicatively coupled to each other and the probe 3 can communicate to the base station 16.

The above described method of exchanging information requires that the internal clocks of the control units 15 and 17 are coordinated with each other. According to an alternative embodiment, the coordination of the clocks can be obtained by compensating for the difference between the two clocks by a double exchange of messages between the probe 3 and the base station 16, such messages incorporating the timestamp corresponding to the instant of transmission of the first pulse of the message itself.

According to a further embodiment of the present invention, the reply message is not transmitted by the probe 3 as a consequence of an internal event periodically generated, but as a result of a different event detected during the stand-by state.

The accelerometer 19 is active while the probe 3 is in the stand-by state for detecting the acceleration along a certain direction, for example a direction which is parallel to the longitudinal axis of the operative head 8, in particular to the longitudinal axis of the spindle when the probe 3 is fixed to the operative head 8. In this way, vibrations that are generated when the operative head 8 engages and grips the probe 3 can be detected by the accelerometer 19 as accelerations. If the detected acceleration has determined features, the probe 3 transmits the request message. In particular, according to a possible embodiment, if the detected acceleration has a peak having an amplitude greater than a threshold acceleration value and a duration shorter than a threshold time value, then the probe 3 transmits the request message.

According to a further embodiment of the present invention, not illustrated in the drawings, at least the transceiver 24 of the base station 16 comprises two receivers including two respective antennas that are arranged at a predetermined mutual distance for receiving the request message. The control unit 17 of the base station 16 collects from said two receivers a first received request message and a second received request message and detects two respective instants of reception.

The control unit 17 is configured for calculating an arrival time difference as a function of the two instants of reception and for estimating an arrival angle of the request message on the basis of the arrival time difference. The base station 16 transmits the reply message if, in addition to be satisfied the predetermined condition about the estimated distance, also on the estimated arrival angle complies with a further predetermined condition, for example if the estimated arrival angle is less than a predetermined angle indicative of the position of the working area 6 with respect to the position of the base station 16. According to an alternative embodiment—not shown in the figures—an additional second electronic device, substantially equal to the second electronic device 16, is arranged at a predetermined distance from it. In other words, two base stations 16—arranged in two different points of the machine and interconnected by the communication interface 18—receive the request message. Also in this case a first request message received and a second request message received are processed in the respective control units 17 connected via the communication interface 18, and the respective instants of reception are detected. The subsequent processing is the same as in the previously described embodiment, and is carried out by one or both the control units 17 which dialog between them, and at least one of the base stations 16 transmits the reply message if the conditions previously described relating to distance and angle are satisfied.

The transceiver 24 and the control unit 17 are made with digital electronic circuits of a known type which allow to detect times of the order of magnitude of one hundredth of the pulse duration TI. As a consequence, the method described above allows to estimate distances between the probe 3 and the base station 16 with a resolution of the order of magnitude of one centimeter.

The above described method of exchanging information substantially performs a procedure of self-recognition and is particularly advantageous when the probe 3 must be communicatively coupled to the base station 16 without the intervention of any operator or external system, in a large area in which there are different industrial apparatuses provided with respective base stations and probes that have to talk only within their industrial apparatuses.

Although the above description makes reference to a particular embodiment, the invention has not to be considered as being limited to this embodiment, since all those changes, modifications, simplifications and applications covered by the appended claims belong to its scope. For instance different sensor(s) may be provided for in addition to, or in place of, the touch trigger probe 3.

The invention claimed is:

1. A wireless digital communication method for communication between a first electronic device and a second electronic device of an industrial apparatus, the method comprising the following steps:
    encoding, by the first electronic device, at least one bit of information by a respective sequence of pulses having a certain number of pulses that alternate with a corresponding number of silence intervals, each pulse of said sequence of pulses having a pulse duration shorter than or equal to 10 nanoseconds (ns) and said silence intervals having respective silence durations longer than or equal to 30 ns;
    transmitting, by the first electronic device, a radio signal comprising a plurality of radio pulses corresponding to said sequence of pulses without modulating any radio carrier; and
    receiving and decoding, by the second electronic device, said radio signal to obtain said at least one bit of information.

2. The method according to claim 1, wherein the step of encoding at least one bit of information by a sequence of pulses comprises: —modulating a polarity of said sequence of pulses as a function of a value of said at least one bit of information.

3. The method according to claim 1, wherein the step of encoding at least one bit of information by a sequence of pulses comprises: —modulating said silence durations relating to said sequence of pulses as a function of a value of said at least one bit of information.

4. The method according to claim 3, wherein the step of modulating said silence durations relating to said sequence of pulses as a function of the value of said bit of information comprises: —modulating said silence durations with a first sequence of durations or a second sequence of durations according to whether said at least one bit of information has a first logical value or, respectively, a second logical value.

5. The method according to claim 4, wherein each of said first and second sequences of durations comprises a respective alternation of two duration values.

6. The method according to claim 1, wherein the step of encoding at least one bit of information with a sequence of pulses comprises: —modulating an amplitude of said sequence of pulses as a function of a value of said at least one bit of information in accordance with an On-Off Keying modulation.

7. The method according to claim 1, including the following additional steps:
    transmitting, by the first electronic device, when it is in a stand-by state, a request message comprising a plurality of bits of information and an instant of transmission of a first pulse of said sequence of pulses of a first bit of information of the request message;

receiving, by the second electronic device, the request message, extracting the instant of transmission from the received request message and detecting the instant of reception of the first pulse of the received request message;

calculating, by the second electronic device, a time of flight of the request message on the basis of the instant of transmission and of the instant of reception;

estimating, by the second electronic device, a distance between said two electronic devices as a function of the time of flight;

when the estimated distance complies with a predetermined condition, transmitting, by the second electronic device, a reply message; and upon receiving the reply message, switching, by the first electronic device, to an operating state in which the two electronic devices are communicatively coupled to each other.

8. The method according to claim 7, wherein the step of transmitting, by the first electronic device, when it is in a stand-by state, a request message comprises:

periodically generating an event; and transmitting the request message at each event.

9. The method according to claim 7, wherein the step of transmitting, by the first electronic device, when it is in a stand-by state, a request message comprises:

detecting an acceleration at least along a certain direction by means of an accelerometer on the first electronic device; and when the detected acceleration has determined features, transmitting the request message.

10. The method according to claim 9, wherein said determined features of the detected acceleration comprise a peak having an amplitude greater than a threshold acceleration value and a duration shorter than a threshold time value.

11. The method according to claim 7, wherein the second electronic device comprises two receivers comprising two respective antennas arranged at a predetermined mutual distance, the step of receiving the request message including: receiving, by means of said two receivers, the request message;

the step of detecting the instant of reception of the first pulse of the received request message including: detecting two instants of reception of a first received request message and, respectively, a second received request message received by the two receivers;

the method also comprising: calculating, by the second electronic device, an arrival time difference as a function of said two instants of reception and estimating an arrival angle of the request message on the basis of the arrival time difference; and said reply message being transmitted when the estimated distance complies with said predetermined condition and the estimated arrival angle complies with a further predetermined condition.

12. The method according to claim 7 comprising an additional second electronic device substantially equal to the second electronic device, arranged at a predetermined distance from and connected to the second electronic device through a communication interface, the step of receiving the request message including: receiving the request message through the receivers of said second electronic device and additional second electronic device;

the step of detecting the instant of reception of the first pulse of the received request message including: detecting two instants of reception of a first received request message and of a second received request message by the second electronic device and the additional second electronic device, respectively;

the method also comprising: —calculating, by the second electronic device and/or additional second electronic device, an arrival time difference as a function of said two instants of reception and estimating an arrival angle of the request message on the basis of the arrival time difference; and said reply message being transmitted by the second electronic device and/or by the additional second electronic device when the estimated distance complies with said predetermined condition and the estimated arrival angle complies with a further predetermined condition.

13. A wireless digital communication system for communication between a first and a second electronic devices of an industrial apparatus; the wireless digital communication system comprising, for each of said first and second electronic devices, respective encoding and decoding devices and respective radio transceivers, said encoding and decoding devices and said radio transceivers being configured to implement the method according to claim 1.

14. An industrial apparatus comprising a first and a second electronic devices and a wireless digital communication system according to claim 13.

15. The apparatus according to claim 14, wherein each of said first and second electronic devices includes said respective encoding and decoding devices and said respective radio transceivers.

16. An industrial apparatus comprising a first and a second electronic devices each of which comprises respective encoding and decoding devices, respective radio transceivers and respective control units, said encoding and decoding devices and said radio transceivers forming a wireless digital communication system for communication between said first and second electronic devices, said wireless digital communication system and said control units being configured to implement the method according to claim 7.

17. An industrial apparatus comprising a first and a second electronic devices each of which comprises respective encoding and decoding devices, respective radio transceivers and respective control units, said encoding and decoding devices and said radio transceivers forming a wireless digital communication system for communication between said two electronic devices, said radio transceivers of at least said second electronic device comprising two receivers with respective antennas arranged at a predetermined reciprocal distance; said wireless digital communication system and said control units being configured to implement the method according to claim 11.

18. An industrial apparatus comprising a first electronic device, a second electronic device and an additional second electronic device, which is arranged at a predetermined distance from the second electronic device and is substantially equal to the second electronic device, each of the electronic devices comprising respective encoding and decoding devices, respective radio transceivers and respective control units, said encoding and decoding devices and said radio transceivers forming a wireless digital communication system for communication between said electronic devices, said wireless digital communication system and said control units being configured to implement the method according to claim 12.

19. The apparatus according to claim 14, including a machine tool which comprises a frame and a movable operative head mounted on the frame; said first electronic device being connectable to the operative head and said second electronic device being connected to the frame.

20. The apparatus according to claim 14, wherein said first electronic device is constituted by a probe for carrying out checks on a workpiece and providing corresponding readings, and the second electronic device is constituted by a base station, which comprises a control unit configured to collect said readings through said wireless digital communication system.

21. The apparatus according to claim 16, including a machine tool which comprises a frame and a movable operative head mounted on the frame; said first electronic device being connectable to the operative head and said second electronic device being connected to the frame.

22. The apparatus according to claim 16, wherein said first electronic device is constituted by a probe for carrying out checks on a workpiece and providing corresponding readings, and the second electronic device is constituted by a base station, which comprises a control unit configured to collect said readings through said wireless digital communication system.

* * * * *